United States Patent
Kaur et al.

(10) Patent No.: US 11,863,180 B2
(45) Date of Patent: Jan. 2, 2024

(54) FAIL-SAFE SWITCH FOR MULTIDOMAIN SYSTEMS

(71) Applicant: TEXAS INSTRUMENTS INCORPORATED, Dallas, TX (US)

(72) Inventors: Divya Kaur, Bangalore (IN); Muthusubramanian N. Venkateswaran, Bangalore (IN); Vinod Menezes, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 17/733,714

(22) Filed: Apr. 29, 2022

(65) Prior Publication Data

US 2023/0062353 A1    Mar. 2, 2023

(30) Foreign Application Priority Data

Aug. 24, 2021  (IN) .............................. 202141038191

(51) Int. Cl.
*H03M 1/12* (2006.01)
*H03K 19/0185* (2006.01)

(52) U.S. Cl.
CPC ....... *H03K 19/018521* (2013.01); *H03M 1/12* (2013.01)

(58) Field of Classification Search
None
See application file for complete search history.

(56) References Cited

U.S. PATENT DOCUMENTS

| | | | |
|---|---|---|---|
| 6,100,719 A * | 8/2000 | Graves | H03K 19/00315 326/86 |
| 6,163,199 A | 12/2000 | Miske et al. | |
| 6,911,860 B1 | 6/2005 | Wang et al. | |
| 7,119,601 B2 * | 10/2006 | Grimone, III | H03K 17/6872 327/404 |
| 9,520,869 B2 | 12/2016 | Fiedorow et al. | |
| 9,871,505 B2 * | 1/2018 | Desel | H03K 17/6874 |
| 10,601,216 B2 * | 3/2020 | Muench | H03K 17/08122 |

OTHER PUBLICATIONS

Anonymous: "Analog-to-digital converter—Wikipedia", Jul. 8, 2017 (Jul. 8, 2017), XP055389882, Retrieved from the Internet: URL:https://en.wikipedia.org/wiki/Analog-to-digital_converter [retrieved on Jul. 11, 2017], 14 pgs.
International Search Report, International Patent Application No. PCT/US2022/041229, dated Dec. 7, 2022, 4 pgs.

* cited by examiner

*Primary Examiner* — Jeffery S Zweizig
(74) *Attorney, Agent, or Firm* — Valerie M. Davis; Frank D. Cimino

(57) ABSTRACT

In described examples, a circuit includes a switch. The switch includes first transistors and second transistors. A voltage generation circuit is coupled to the switch. A level shifter is coupled to the voltage generation circuit and is configured to receive a control signal. A logic unit is coupled to the level shifter and the voltage generation circuit. The logic unit is configured to generate a secondary signal. The first transistors are configured to receive the control signal, and the second transistors are configured to receive the secondary signal.

22 Claims, 4 Drawing Sheets

FAIL-SAFE SWITCH FOR MULTIDOMAIN SYSTEMS

CROSS-REFERENCE TO RELATED APPLICATION

This application claims priority to India Provisional Patent Application No. 202141038191 filed Aug. 24, 2021, which is hereby incorporated by reference in its entirety.

BACKGROUND

This description relates generally to analog-to-digital converters (ADCs), and more particularly to a fail-safe switch in a high-speed ADC.

Many systems (such as telemetry systems, controllers, automobiles, environmental sensing applications and medical applications) have an analog to digital converter (ADC) that samples an analog signal to generate a representative digital signal. The conversion process includes periodically sampling the analog signal and converting each sampled signal to a corresponding digital signal. Multiple applications specify the ADCs to sample at high data rates, operate at low power, and provide high resolution. The high-speed ADCs have switches that likewise operate at high-speed with low impedance. Those objectives may conflict with one another. Moreover, many of those systems are battery powered, portable or remote devices, so power consumption is a concern. Accordingly, relatively low quiescent current is often specified for the switches.

SUMMARY

In described examples, a circuit includes a switch. The switch includes first transistors and second transistors. A voltage generation circuit is coupled to the switch. A level shifter is coupled to the voltage generation circuit and is configured to receive a control signal. A logic unit is coupled to the level shifter and the voltage generation circuit. The logic unit is configured to generate a secondary signal. The first transistors are configured to receive the control signal, and the second transistors are configured to receive the secondary signal.

DETAILED DESCRIPTION OF EXAMPLE EMBODIMENTS

Figure 1:
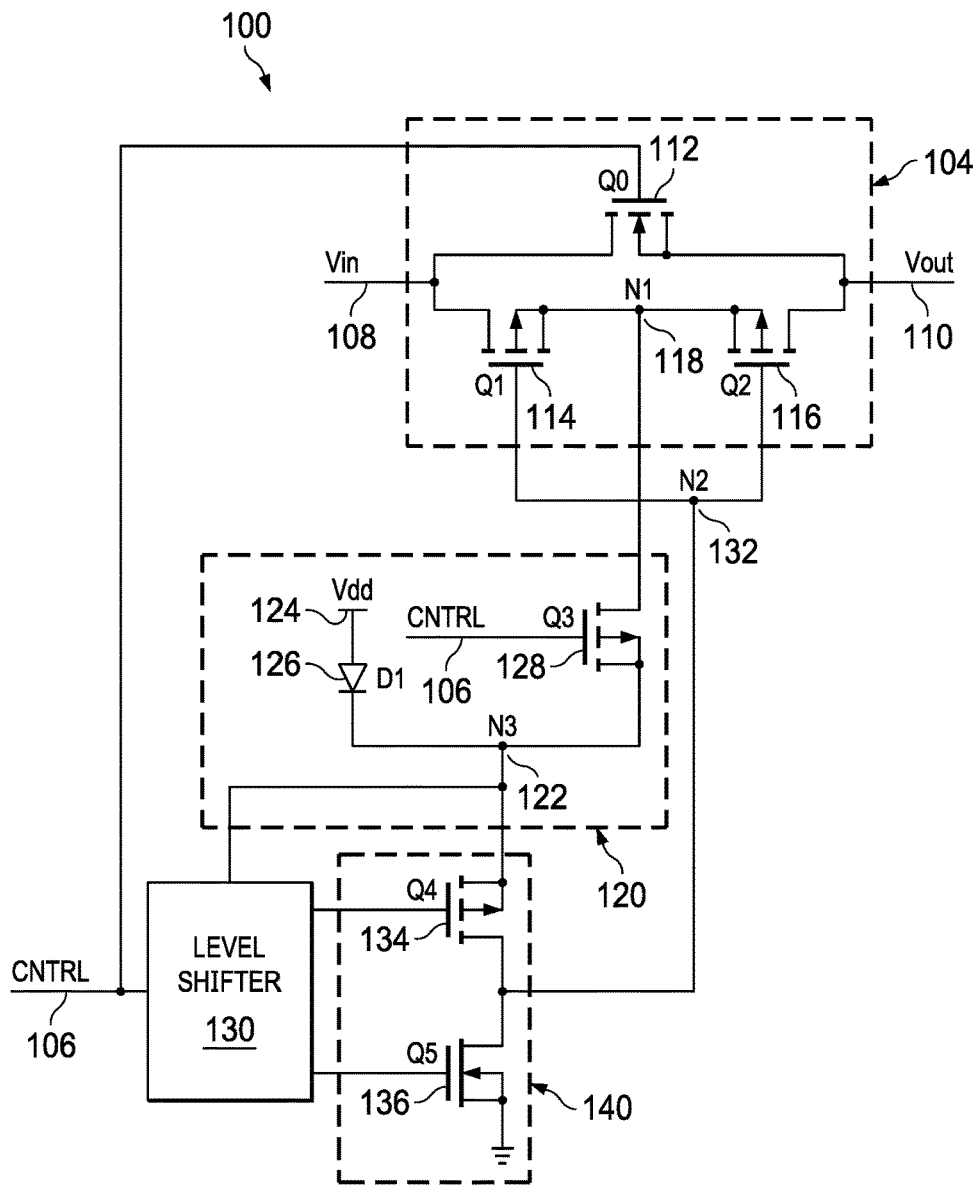
FIG. 1 is a schematic of a circuit, according to an embodiment.

FIG. 1 is a schematic of a circuit 100, according to an embodiment. The circuit includes a switch 104, a voltage generation circuit 120, a level shifter 130 and a logic unit 140. The voltage generation circuit 120 is coupled to the switch 104. The level shifter 130 is coupled to voltage generation circuit 120. The logic unit 140 is coupled to the voltage generation circuit 120, the level shifter 130 and the switch 104. The switch 104 includes first transistors and second transistors. The first transistors include one or more n-channel field effect transistors (NFETs), and the second transistors include one or more p-channel field effect transistors (PFETs). The first transistors include a first NFET Q0 112, and the second transistors include a first PFET Q1 114 and a second PFET Q2 116.

A drain terminal of the first NFET Q0 112: (a) is coupled to a source terminal of the first PFET Q1 114; and (b) receives an input signal Vin 108. A gate terminal of the first NFET Q0 112 receives a control signal CNTRL 106. A bulk terminal of the first NFET Q0 112, in one example, is coupled to a supply voltage Vdd 124. In another example, the bulk terminal is coupled to one of the source, drain or gate terminal of the first NFET Q0 112 based on requirement of the circuit 100. The source terminal of the first PFET Q1 114 receives the input signal Vin 108, and a gate terminal of the first PFET Q1 114 is coupled to the logic unit 140. A drain terminal of the first PFET Q1 114 is coupled to a drain terminal of the second PFET Q2 116 at a first node N1 118. A gate terminal of the second PFET Q2 116 is coupled to the logic unit 140, and a source terminal of the second PFET Q2 116 is coupled to a source terminal of the first NFET Q0 112.

The voltage generation circuit 120 is coupled to the second transistors in the switch 104. The voltage generation circuit 120 includes a diode D1 126 and a third PFET Q3 128. The diode D1 126 receives the supply voltage Vdd 124 and is coupled to the level shifter 130 and the logic unit 140. The third PFET Q3 128 is coupled to the second transistors in the switch 104. Both the diode D1 126 and the third PFET Q3 128 are coupled to the level shifter 130 and the logic unit 140 at a third node N3 122. A source terminal of the third PFET Q3 128 is coupled to drain terminals of the first PFET Q1 114 and the second PFET Q2 116. A gate terminal of the third PFET Q3 128 receives the control signal CNTRL 106. A drain terminal of the third PFET Q3 128 is coupled to the level shifter 130 and the logic unit 140.

The logic unit 140 includes a primary PFET Q4 134 and a secondary NFET Q5 136. The primary PFET Q4 134 and the secondary NFET Q5 136 are coupled to the level shifter 130 and the switch 104. A source terminal of the primary PFET Q4 134 is coupled to both the diode D1 126 and the third PFET Q3 128 in the voltage generation circuit 120. A gate terminal of the primary PFET Q4 134 is coupled to the level shifter 130. A drain terminal of the primary PFET Q4 134 is coupled to a drain terminal of the secondary NFET Q5 136 at a second node N2 132. The drain terminals of the primary PFET Q4 134 and the secondary NFET Q5 136 are coupled to the gate terminals of the first PFET Q1 114 and the second PFET Q2 116. A gate terminal of the secondary NFET Q5 136 is coupled to the level shifter 130, and a source terminal of the secondary NFET Q5 136 is coupled to a ground terminal.

The circuit 100 may include one or more conventional components that are not described herein for brevity. Each component of the circuit 100 may also be coupled to other components or blocks in FIG. 1, but those connections are not described herein for brevity. Also, each block or component of FIG. 1 may be coupled to conventional components of a system using the circuit 100, which are also not shown in FIG. 1 for brevity.

In operation, the switch 104 receives the input signal Vin 108 and generates an output signal Vout 110. The voltage generation circuit 120 receives the supply voltage Vdd 124, the control signal CNTRL 106, and a voltage at the first node N1 118. The voltage generation circuit 120 generates a first signal at the third node N3 122. The level shifter 130 and the logic unit 140 receive the first signal from the voltage generation circuit 120. The level shifter 130: (a) receives the first signal and the control signal CNTRL 106; and (b) generates a primary signal. The primary signal, in one version, is a level shifted version of the control signal CNTRL 106. The logic unit 140 receives the first signal from the voltage generation circuit 120 and the primary signal from the level shifter 130. The logic unit 140 generates a secondary signal, which is provided to the second node N2 132. The gate terminals of the first PFET Q1 114 and the second PFET Q2 116 receive the secondary signal.

The voltage generation circuit 120 operates as a multiplexer that provides a maximum one of a first voltage or a second voltage (i.e., whichever one is higher). The first voltage is (or is proportional to) the voltage at the first node N1 118, and the second voltage is (or is proportional to) a difference between a threshold voltage of the diode D1 126 and the supply voltage Vdd 124. In one example, the threshold voltage is proportional to a voltage drop across the diode D1 126. In another example, the functionality of the diode D1 126 can be implemented using one or more of, or a combination of, diode, PN junction diode, Schottky diode, Zener diode and transistors, which ensure unidirectional flow of current from the supply voltage Vdd 124 towards the third node N3 122. The voltage generation circuit 120 provides a maximum one of the first or second voltages (i.e., whichever one is higher) as the first signal at the third node N3 122. In one version, the voltage at the third node N3 122 keep the level shifter 130 operational. The combination of the diode D1 126 and the third PFET Q3 128 is one way of implementing voltage generation circuit 120, and the voltage generation circuit 120 may be implemented with hardware elements (and/or operations in a different order) in configurations different than those described herein.

When the control signal CNTRL 106 has a logic low state (logic '0'), the first NFET Q0 112 has OFF state (i.e., is switched OFF, or is OPENED, to stop conducting current), and the third PFET Q3 128 has ON state (i.e., is switched ON, or is CLOSED, to conduct current). The voltage at the third node N3 122 is equal to the first voltage (i.e., the voltage at the first node N1 118). The primary signal generated by the level shifter 130 results in switching ON the primary PFET Q4 134 and switching OFF the secondary NFET Q5 136. As a result, a voltage at the second node N2 132 is equal to the voltage at the third node N3 122. This results in switching OFF of the second PFET Q2 116. Thus, the switch 104 stops generating the output signal Vout 110 responsive to the input signal Vin 108 when the control signal CNTRL 106 has a logic low state.

When the control signal CNTRL 106 has a logic high state (logic '1'), the first NFET Q0 112 has ON state. When the control signal CNTRL 106 has a logic high state and is greater than the voltage at the first node N1 118, the third PFET Q3 128 has OFF state. When the control signal CNTRL 106 has a logic high state and is less than the voltage at the first node N1 118, the third PFET Q3 128 has ON state. The voltage at the third node N3 122 is a maximum one of the first voltage or the second voltage (i.e., whichever one is higher). The primary signal generated by the level shifter 130 results in switching OFF the primary PFET Q4 134 and switching ON the secondary NFET Q5 136. As a result, the second node N2 132 is coupled to the ground terminal through the secondary NFET Q5 136. This results in switching ON of the first PFET Q1 114 and the second PFET Q2 116. Thus, the switch 104 generates the output signal Vout 110 responsive to the input signal Vin 108 when the control signal CNTRL 106 has a logic high state.

Thus, circuit 100 provides the switch 104 that operates at high-speed and has low impedance when the output signal Vout 110 is generated. The switch 104 is useful in applications requiring high-speed ADCs. Also, when the control signal CNTRL 106 has a logic low state (logic '0'), the circuit 100 enables failsafe operation even when the input signal Vin 108 is higher than the supply voltage Vdd 124 or even when the input signal Vin 108 is as low as 0 volt. When the input signal Vin 108 is higher than the supply voltage Vdd 124, the circuit 100 provides for complete switching OFF of the second PFET Q2 116, so output signal Vout 110 is not generated. This is because the voltages at the first node N1 118 and the second node N2 132 are equal. When the input signal Vin 108 is low, for example 0 volt, the level shifter 130 provides for complete switching OFF of the second PFET Q2 116. This is because the level shifter 130 is driven by the supply voltage Vdd 124. The voltage at the first node N1 118 acts as a failsafe input signal, which drives the gate terminals of the first PFET Q1 114 and the second PFET Q2 116. Thus, the circuit 100 solves the failsafe issue without drawing static current either from the supply voltage Vdd 124 or from the input signal Vin 108. This enables the switch 104 to operate as a high-speed switch with no quiescent current.

The voltage generation circuit 120 ensures that a maximum one of the first voltage or the second voltage (i.e., whichever one is higher) is provided to the level shifter 130, which drives the first PFET Q1 114 and the second PFET Q2 116. In conventional circuits, the switches are implemented using multiple resistors and capacitors which results in large RC time constants, and hence cannot operate as high-speed switches. The switch 104 in the circuit 100 operate as a high-speed switch because no resistors and capacitors are used, and also the transistors present in switch 104 undergo a fast transition when there is a change in state of control signal CNTRL 106. In some other conventional circuits, the switch is implemented using an ideal diode. The ideal diode is implemented using an NFET pass-gate ideal diode and/or a PFET pass-gate ideal diode. However, an ideal diode requires a high voltage charge pump which increases the power consumption of the circuit. The diode D1 126 in circuit 100 is not required to be an ideal diode, and accordingly the circuit 100 may consume less power than conventional circuits. The combination of the voltage generation circuit 120, the level shifter 130 and the logic unit 140 act as a zero quiescent current gate driver for the first PFET Q1 114 and the second PFET Q2 116.

The voltage generation circuit 120 provides for automatic switching between the first voltage and the second voltage. Thus, circuit 100 does not require a separate digital switch to switch between the supply voltage Vdd 124 or the voltage at the first node N1 118. Another advantage of voltage generation circuit 120 is that the circuit 100 does not require a sub-regulator to generate a maximum one of the first voltage or the second voltage (i.e., whichever one is higher). The voltage generation circuit 120 provides a smooth switchover between the first voltage and the second voltage without having blips in the output signal Vout 110. All these features enable the circuit 100 to be used as a failsafe switch operable at high frequencies in multi-domain systems.

Figure 2:
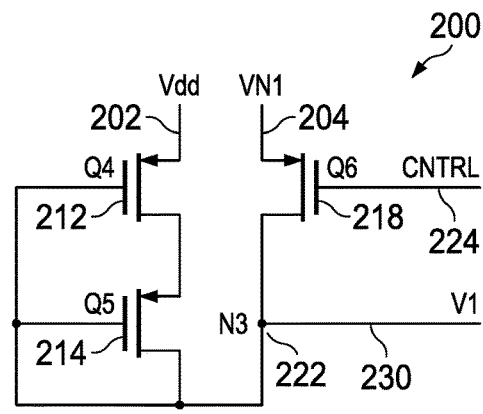
FIG. 2 is a schematic of a voltage generation circuit, according to an embodiment.

FIG. 2 is a schematic of a voltage generation circuit 200, according to an embodiment. The voltage generation circuit 200 is another implementation of the voltage generation circuit 120 of FIG. 1. The voltage generation circuit 200 includes a fourth PFET Q4 212, a fifth PFET Q5 214 and a sixth PFET Q6 218. The fourth PFET Q4 212 receives a supply voltage Vdd 202. The fifth PFET Q5 214 is coupled to the fourth PFET Q4 212. The sixth PFET Q6 218 is coupled to the fifth PFET Q5 214.

A source terminal of the fourth PFET Q4 212 receives the supply voltage Vdd 202. A drain terminal of the fourth PFET Q4 212 is coupled to a source terminal of the fifth PFET Q5 214. A gate terminal of the fourth PFET Q4 212 is coupled to a gate terminal of the fifth PFET Q5 214 and also to a third node N3 222. A source terminal of the sixth PFET Q6 218 is coupled to second transistors in a switch (similar to the second transistors in the switch 104 in FIG. 1). The source terminal of the sixth PFET Q6 218 (similar to the third PFET Q3 128 in FIG. 1) is coupled to the second transistors in the switch (such as switch 104 of FIG. 1). The source terminal of the sixth PFET Q6 218 receives a voltage VN1 204. The voltage VN1 204 is generated at a first node (similar to the first node N1 118 of FIG. 1). In one version, the first node N1 similar to the first node N1 118 is formed by coupling a drain terminal of a first PFET and a source terminal of a second PFET, the first PFET and the second PFET are part of the second transistors.

A gate terminal of the sixth PFET Q6 218 receives a control signal CNTRL 224. The control signal CNTRL 224 is similar to the control signal CNTRL 106 of FIG. 1. A drain terminal of the sixth PFET Q6 218 is coupled to the third node N3 222. In FIG. 1, the third node N3 122 is coupled to the level shifter 130 and the logic unit 140. Similarly, the third node N3 222 is coupled to a level shifter and a logic unit, which are not shown for brevity. Thus, the gate terminal of the fourth PFET Q4 212, the gate terminal of the fifth PFET Q5 214 and the drain terminal of the sixth PFET Q6 218 are all coupled to the level shifter (similar to the level shifter 130 of FIG. 1).

In operation, the voltage generation circuit 200 receives the supply voltage Vdd 124, the control signal CNTRL 224 and the voltage VN1 204, which is generated at the first node N1 (similar to the first node N1 118 in FIG. 1). The voltage generation circuit 120 generates a first signal V1 230. The first signal V1 230 is generated at the third node N3 222. The level shifter and the logic unit receives the first signal V1 230 from the voltage generation circuit 120.

The voltage generation circuit 200 operates as a multiplexer that provides a maximum one of the voltage VN1 204 or the second voltage (i.e., whichever one is higher). The second voltage is (or is proportional to) a difference between the supply voltage Vdd 202 and a threshold voltage of the fourth PFET Q4 212 (and of the fifth PFET Q5 214). The voltage generation circuit 200 provides a maximum one of the voltage VN1 204 or the second voltage (i.e., whichever one is higher) at the third node N3 222. In one version, the voltage at the third node N3 222 keep the level shifter operational. The combination of the fourth PFET Q4 212, the fifth PFET Q5 214 and the sixth PFET Q6 218 is one way of implemented voltage generation circuit 200, and the voltage generation circuit 200 may be implemented with hardware elements (and/or operations in a different order) in configurations different than those described herein.

When the control signal CNTRL 106 has a logic low state (logic '0'), the sixth PFET Q6 218 has ON state. The voltage at the third node N3 222 is equal to the voltage VN1 204 (i.e., the voltage at the first node N1, such as the first node N1 118 of FIG. 1). When the control signal CNTRL 106 has a logic high state (logic '1'), the voltage at the third node N3 222 is a maximum one of the first voltage or the second voltage (i.e., whichever one is higher). When the control signal CNTRL 224 has a logic high state and is greater than VN1 204, the sixth PFET Q6 218 has OFF state. When the control signal CNTRL 224 has a logic high state and is less than VN1 204, the sixth PFET Q6 218 has ON state.

The voltage generation circuit 200 ensures that a maximum one of the voltage VN1 204 or the second voltage (i.e., whichever one is higher) is provided to the level shifter, which drives the second transistors (such as the first PFET Q1 114 and the second PFET Q2 116 in FIG. 1) in the switch. This enables the switch to turn ON and OFF at high-speed.

The voltage generation circuit 200 provides for automatic switching between the voltage VN1 204 and the second voltage. Thus, circuit 100 does not require a separate digital switch to switch between the supply voltage Vdd 124 or the voltage VN1 204. Another advantage of voltage generation circuit 200 is that a sub-regulator is not required to generate a maximum one of the voltage VN1 204 or the second voltage (i.e., whichever one is higher). The voltage generation circuit 200 provides a smooth switchover between the voltage VN1 204 and the second voltage. For example, when the voltage generation circuit 200 is used in a CMOS switch, it enables the switch to be used as a failsafe switch operable at high frequencies in multi-domain systems.

Figure 3:
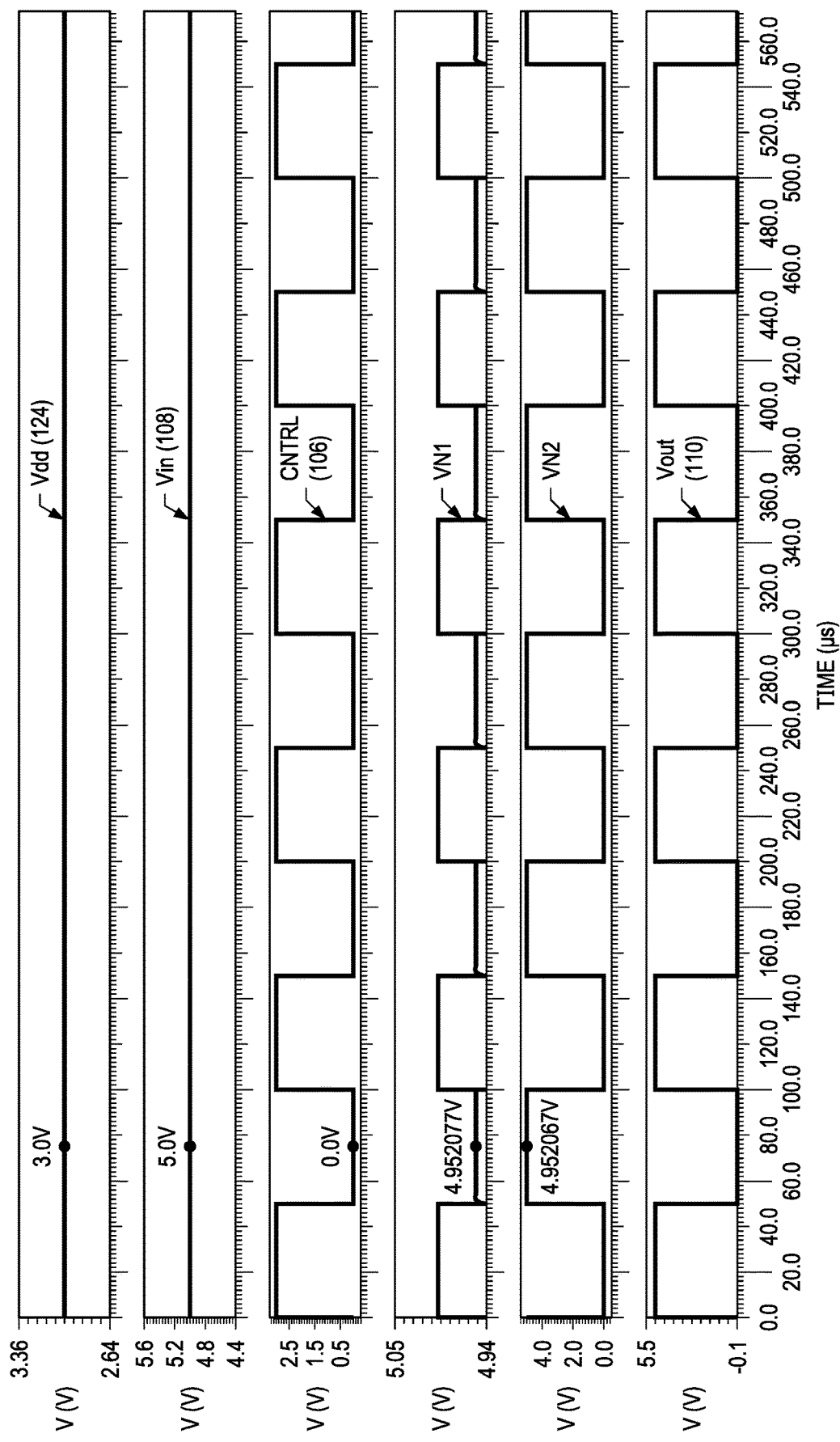
FIG. 3 is a timing diagram of operation of the circuit of FIG. 1, according to an embodiment.

FIG. 3 is a timing diagram of operation of the circuit of FIG. 1, according to an embodiment. The timing diagram is described in connection with the circuit 100 of FIG. 1. The timing diagram shows the supply voltage Vdd 124, the input signal Vin 108, the output signal Vout 110, the control signal CNTRL 106, the first voltage VN1 at the first node N1 118, and a voltage VN2 at the second node N2 132.

In the timing diagram, as an example, the supply voltage Vdd 124 and the input signal Vin 108 are fixed at constant voltage values. When the control signal CNTRL 106 has a logic low state (logic '0'), the first NFET Q0 112 has OFF state, and the third PFET Q3 128 has ON state. The voltage at the third node N3 122 is equal to the first voltage VN1 (i.e., the voltage at the first node N1 118). The primary signal generated by the level shifter 130 results in switching ON the primary PFET Q4 134 and switching OFF the secondary NFET Q5 136. As a result, the voltage VN2 at the second node N2 132 is equal to the voltage at the third node N3 122. Thus, the voltage VN2 is equal to the first voltage VN1. This results in switching OFF of the second PFET Q2 116. Thus, the switch 104 stops generating the output signal Vout 110 responsive to the input signal Vin 108 when the control signal CNTRL 106 has a logic low state.

When the control signal CNTRL 106 has a logic high state (logic '1'), the first NFET Q0 112 has ON state. When the control signal CNTRL 106 has a logic high state and is greater than the voltage at the first node N1 118, the third PFET Q3 128 has OFF state. When the control signal CNTRL 106 has a logic high state and is less than the voltage at the first node N1 118, the third PFET Q3 128 has ON state. The voltage at the third node N3 122 is a maximum one of the first voltage of the second voltage (i.e., whichever one is higher). The primary signal generated by the level shifter 130 results in switching OFF the primary PFET Q4 134 and switching ON the secondary NFET Q5 136. As a result, the second node N2 132 is coupled to the ground terminal through the secondary NFET Q5 136. Thus, the voltage VN2 at the second node N2 132 has a logic low state. This results in switching ON of the first PFET Q1 114 and the second PFET Q2 116. Thus, the switch 104 generates the output signal Vout 110 responsive to the input signal Vin 108 when the control signal CNTRL 106 has a logic high state.

Thus, circuit 100 provides a switch 104 that operates at high-speed and has low impedance when the output signal Vout 110 is generated. The switch 104 is useful in applications requiring high-speed ADCs. Also, when the control signal CNTRL 106 has a logic low state (logic '0'), the circuit 100 enables failsafe operation even when the input signal Vin 108 is higher than the supply voltage Vdd 124 or even when the input signal Vin 108 is as low as 0 volt. When the input signal Vin 108 is higher than the supply voltage Vdd 124, the circuit 100 provides for complete switching OFF of the second PFET Q2 116, so output signal Vout 110 is not generated. This is because the voltages at the first node N1 118 and the second node N2 132 are equal. When the input signal Vin 108 is low, for example 0 volt, the level shifter 130 provides for complete switching OFF of the second PFET Q2 116. This is because the level shifter 130 is driven by the supply voltage Vdd 124. The first voltage VN1 at the first node N1 118 acts as a failsafe input signal, which drives the gate terminals of the first PFET Q1 114 and the second PFET Q2 116. Thus, the circuit 100 solves the failsafe issue without drawing static current either from the supply voltage Vdd 124 or from the input signal Vin 108. This enables the switch 104 to operate as a high-speed switch with no quiescent current.

Figure 4:
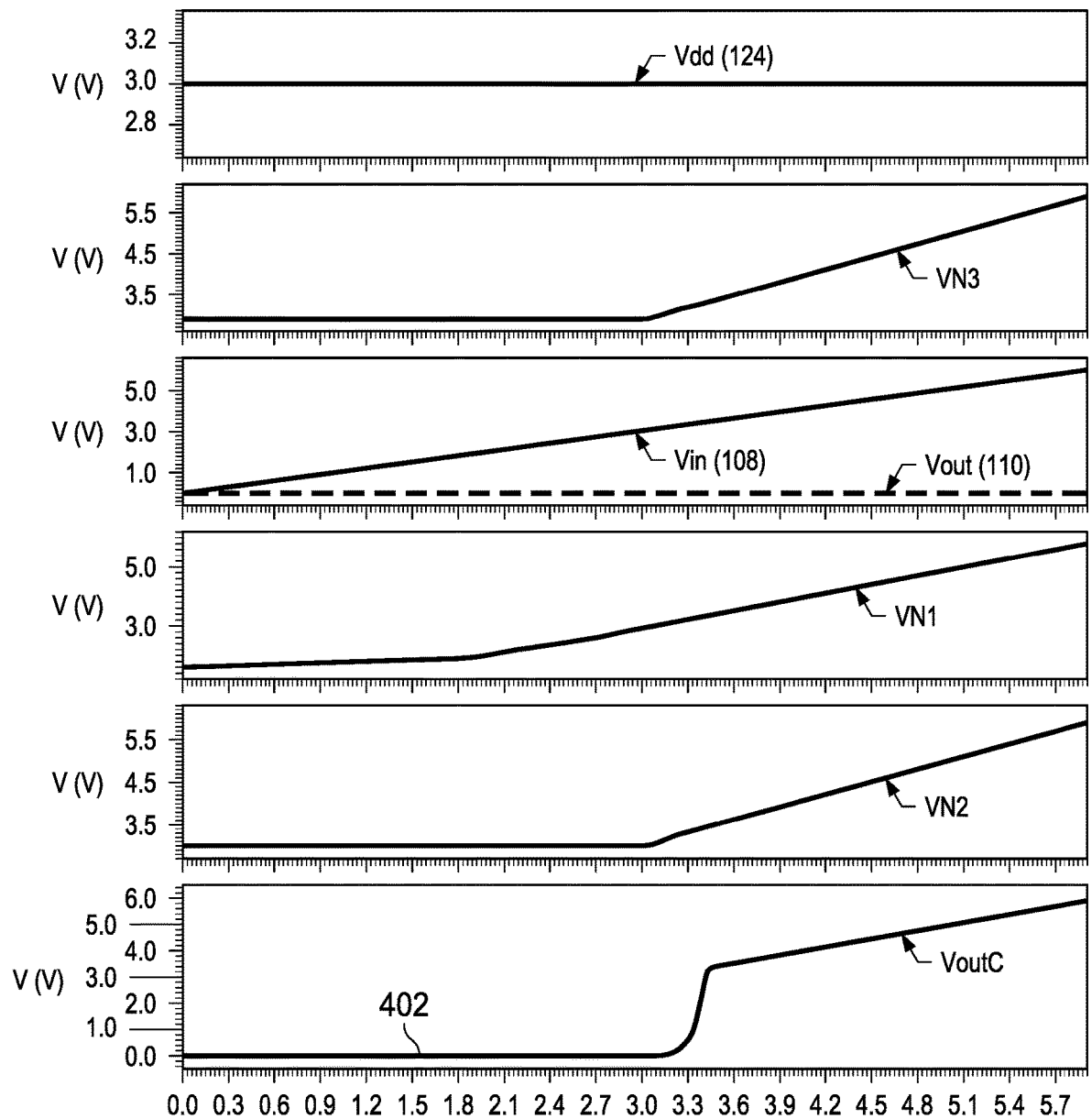
FIG. 4 is a waveform diagram of operation of the circuit of FIG. 1, according to an embodiment.

FIG. 4 is a waveform diagram of operation of the circuit of FIG. 1, according to an embodiment. The waveform diagram is explained in connection with the circuit 100 of FIG. 1. The waveform diagram shows the supply voltage Vdd 124, the input signal Vin 108, the output signal Vout 110, the first voltage VN1 at the first node N1 118, a voltage VN2 at the second node N2 132, and a voltage VN3 at the third node N3 122. The waveform diagram also shows an output signal VoutC 402 in a conventional circuit.

In the waveform diagram, as an example, the supply voltage Vdd 124 is fixed at constant voltage value while the input signal Vin 108 is linearly increasing. When the control signal CNTRL 106 has a logic low state (logic '0'), the first NFET Q0 112 has OFF state, and the third PFET Q3 106 has ON state. A voltage at the third node N3 122 is VN3. As shown in the waveform diagram, the input signal Vin 108 is linearly increasing. The voltage VN1 at the first node N1 118 remains constant when the input signal Vin 108 is less than a threshold voltage of the first PFET Q1 114. When the input signal Vin 108 is greater than the threshold voltage of the first PFET Q1 114, the voltage VN1 at the first node N1 118 follows the input signal Vin 108.

The voltage VN3 at the third node N3 122 remains constant when the voltage VN1 at the first node N1 118 is less than a threshold voltage of the third PFET Q3 128. When the voltage VN1 at the first node N1 118 is greater than the threshold voltage of the third PFET Q3 128, the voltage VN3 at the third node N3 122 follows the voltage VN1 at the first node N1 118. Thus, the voltage VN3 at the third node N3 122 is equal to the first voltage VN1 (i.e., the voltage at the first node N1 118).

The primary signal generated by the level shifter 130 results in switching ON the primary PFET Q4 134 and switching OFF the secondary NFET Q5 136. As a result, the voltage VN2 at the second node N2 132 follows the voltage at the third node N3 122. Thus, the voltage VN2 is equal to the first voltage VN1. This results in switching OFF of the second PFET Q2 116. Thus, the switch 104 stops generating the output signal Vout 110 responsive to the input signal Vin 108 when the control signal CNTRL 106 has a logic low state.

In contrast, in a conventional circuit, a switch used in the circuit 100 is not completely switched OFF which results in generation of the output signal VoutC 402 responsive to the input signal Vin 108. Thus, a conventional circuit does not provide a reliable switch that is completely turned OFF when the control signal CNTRL 106 has a logic low state and the input signal Vin 108 is higher than the supply voltage Vdd 124. However, the switch 104 of circuit 100 provides for complete switching OFF of the second PFET Q2 116. The circuit 100 ensure complete switching OFF of the second PFET Q2 116 even when the input signal Vin 108 is as low as 0 volt or the input signal Vin 108 is higher than the supply voltage Vdd 124. This is ensured as the circuit 100 provides that the voltage VN2 follows the first voltage VN1. Thus, circuit 100 provides the switch 104 that operates at high-speed and has low impedance when the output signal Vout 110 is generated. The switch 104 is useful in multi-domain applications requiring high-speed ADCs.

Figure 5:
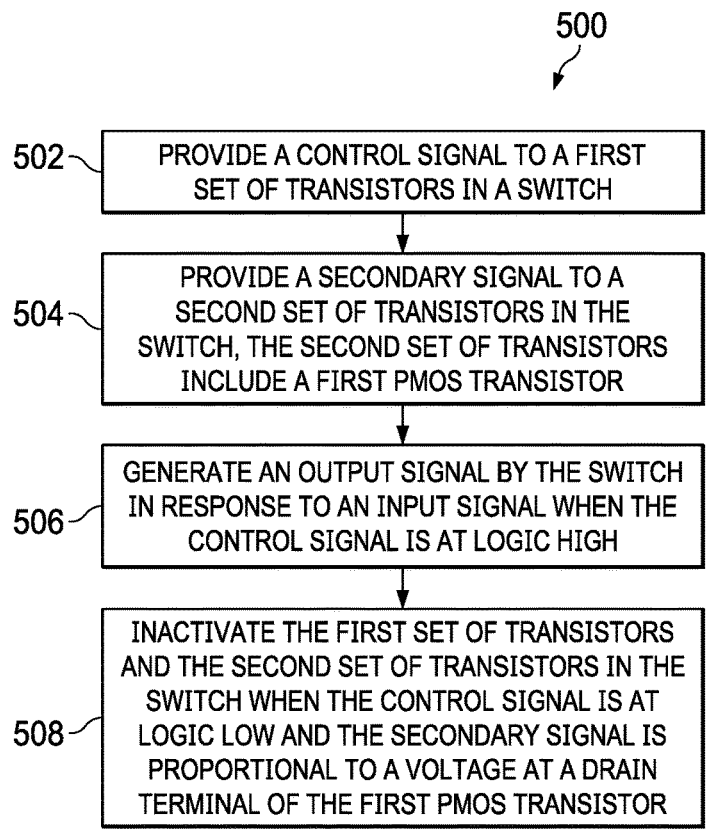
FIG. 5 is a flowchart of a method of operation of a circuit, according to an embodiment.

FIG. 5 is a flowchart 500 of a method of operation of a circuit, according to an embodiment. The flowchart 500 is described in connection with the circuit 100 of FIG. 1. The flowchart starts at step 502 and ends at step 508. At step 502, a control signal is provided to first transistors in a switch. In circuit 100, for example, the switch 104 includes first transistors and second transistors. The first transistors include a first NFET Q0 112, and a gate terminal of the first NFET Q0 112 receives the control signal CNTRL 106. At step 504, a secondary signal is provided to second transistors in the switch. The second transistors include a first PFET. In circuit 100, the second transistors include a first PFET Q1 114 and a second PFET Q2 116. The gate terminals of the first PFET Q1 114 and the second PFET Q2 116 receive the secondary signal.

At step 506, an output signal is generated by the switch responsive to an input signal when the control signal has a logic high state. In circuit 100, the switch 104 generates the output signal Vout 110 responsive to the input signal Vin 108 when the control signal CNTRL 106 has a logic high state. At step 508, the first transistors and the second transistors in the switch are inactivated (i.e., switched OFF) when the control signal has a logic low state and the secondary signal is proportional to a voltage at a drain terminal of the first PFET. When the control signal CNTRL 106 has a logic low state (logic '0'), the first transistors (which include the first NFET Q0 112), and the second transistors (which include the first PFET Q1 114 and the second PFET Q2 116) have OFF state. The secondary signal generated by the logic unit 140 is proportional to a voltage at a drain terminal of the first PFET Q1 114.

A first signal is generated responsive to a supply voltage and the control signal. The circuit 100 includes a voltage generation circuit 120. The voltage generation circuit 120 includes a diode D1 126 and a third PFET Q3 128. The diode D1 126 receives the supply voltage Vdd 124. The third PFET Q3 128 is coupled to the second transistors in the switch 104. Both the diode D1 126 and the third PFET Q3 128 are coupled to the level shifter 130 and the logic unit 140 at a third node N3 122. A source terminal of the third PFET Q3 128 is coupled to drain terminals of the first PFET Q1 114 and the second PFET Q2 116 at a first node N1 118. A gate terminal of the third PFET Q3 128 receives the control signal CNTRL 106. A drain terminal of the third PFET Q3 128 is coupled to the level shifter 130 and the logic unit 140.

The voltage generation circuit 120 receives the supply voltage Vdd 124, the control signal CNTRL 106 and a voltage at the first node N1 118. The voltage generation circuit 120 generates the first signal. The first signal is generated at the third node N3 122. The voltage generation circuit 120 operates as a multiplexer that provides a maximum one of a first voltage or a second voltage (i.e., whichever one is higher). The first voltage is (or is proportional to) the voltage at the first node N1 118, and the second voltage is (or is proportional to) a difference between a threshold voltage of the diode D1 126 and the supply voltage Vdd 124. In one example, the threshold voltage is proportional to a voltage drop across the diode D1 126. In another example, the functionality of the diode D1 126 can be implemented using one or more of, or a combination of, diode, PN junction diode, Schottky diode, Zener diode and transistors, which ensure unidirectional flow of current from the supply voltage Vdd 124 towards the third node N3 122. The voltage generation circuit 120 provides a maximum one of the first or second voltages (i.e., whichever one is higher) as the first signal at the third node N3 122.

A primary signal is generated responsive to the control signal and the first signal. The circuit 100 includes a level shifter 130. The level shifter 130 is coupled to voltage generation circuit 120. The level shifter 130 receives the first signal (from the voltage generation circuit 120) and the control signal CNTRL 106, and generates a primary signal.

The secondary signal is generated responsive to the first signal and the primary signal. The circuit 100 includes a logic unit 140. The logic unit 140 includes a primary PFET Q4 134 and a secondary NFET Q5 136. The primary PFET Q4 134 and the secondary NFET Q5 136 are coupled to the level shifter 130 and the switch 104. A source terminal of the primary PFET Q4 134 is coupled to both the diode D1 126 and the third PFET Q3 128 in the voltage generation circuit 120. A gate terminal of the primary PFET Q4 134 is coupled to the level shifter 130. A drain terminal of the primary PFET Q4 134 is coupled to a drain terminal of the secondary NFET Q5 136 at a second node N2 132. The drain terminals of the primary PFET Q4 134 and the secondary NFET Q5 136 are coupled to the gate terminals of the first PFET Q1 114 and the second PFET Q2 116. A gate terminal of the secondary NFET Q5 136 is coupled to the level shifter 130, and a source terminal of the secondary NFET Q5 136 is coupled to a ground terminal.

The logic unit 140 receives the first signal from the voltage generation circuit 120 and the primary signal from the level shifter 130. The logic unit 140 generates a secondary signal, which is provided to the second node N2 132. The gate terminals of the first PFET Q1 114 and the second PFET Q2 116 receive the secondary signal.

The switch 104 in the circuit 100 generates the output signal Vout 110 responsive to the input signal Vin 108 when the control signal CNTRL 106 has a logic high state. When the control signal CNTRL 106 has a logic high state (logic '1'), the first NFET Q0 112 is activated (i.e., switched ON). The secondary NFET Q5 136, the first PFET Q1 114 and the second PFET Q2 116 are activated. The primary PFET Q4 134 is inactivated. The first signal is equal to a maximum one of the first voltage or the second voltage (i.e., whichever one is higher).

The switch 104 in the circuit 100 stops generating the output signal Vout 110 responsive to the input signal Vin 108 when the control signal CNTRL 106 has a logic low state. When the control signal CNTRL 106 has a logic low state (logic '0'), the first NFET Q0 112 is inactivated, and the third PFET Q3 128 is activated. The secondary NFET Q5 136, and the second PFET Q2 116 are inactivated. The primary PFET Q4 134 is activated. The first signal is equal to the first voltage.

Thus, the method shown in the flowchart 500 enables a switch in a circuit, similar to the circuit 100, to operates at high-speed and with low impedance. This switch is useful in multi-domain systems applications requiring high-speed ADCs. A circuit, enabled by flowchart 500, provides complete switching of the transistors in the switch even when the input signal is as low as 0 volt. This enables the switch to operate as a high-speed switch with no quiescent current.

Figure 6:
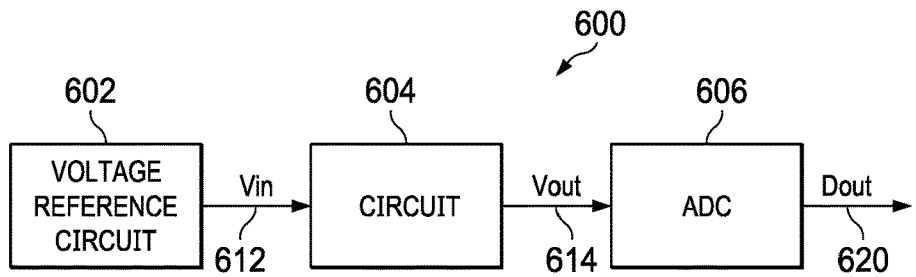
FIG. 6 is a block diagram of an example device in which several aspects of example embodiments can be implemented.

FIG. 6 is a block diagram of an example device 600 in which several aspects of example embodiments can be implemented. The device 600 is, or in incorporated into or is part of a server farm, a vehicle, a communication device, a transceiver, a personal computer, a gaming platform, a computing device, any other type of electronic system, or a portable device such as a battery powered handheld measurement device. The device 600 may include one or more conventional components that are not described herein for brevity.

The device 600 includes a voltage reference circuit 602, a circuit 604 and an analog to digital converter (ADC) 606. The voltage reference circuit 602 provides an input signal Vin 612. The circuit 604 receives the input signal Vin 612 and generates an output signal Vout 614. The circuit 604 is similar, in connection and operation, to the circuit 100 of FIG. 1. The ADC 606 converts the output signal Vout 614 to a digital signal Dout 620. The circuit 604 includes a switch, a voltage generation circuit, a level shifter and a logic unit.

The voltage generation circuit is coupled to the switch. The level shifter is coupled to voltage generation circuit. The logic unit is coupled to the voltage generation circuit, the level shifter and the switch. The switch includes first transistors and second transistors. The first transistors include one or more NFETs, and the second transistors include one or more PFETs. The first transistors and the level shifter receive a control signal. The logic unit generates a secondary signal. The second transistors in the switch receive the secondary signal. The first transistors include a first NFET, and a gate terminal of the first NFET receives the control signal. The second transistors include a first PFET and a second PFET. The gate terminals of the first PFET and the second PFET receive a secondary signal.

The voltage generation circuit includes a diode and a third PFET. A source terminal of the third PFET is coupled to drain terminals of the first PFET and the second PFET at a first node N1. Both the diode and the third PFET are coupled to the level shifter and the logic unit. The voltage generation circuit receives the supply voltage, the control signal and a voltage at the first node N1. The voltage generation circuit generates the first signal.

The level shifter receives the first signal (from the voltage generation circuit) and the control signal, and generates a primary signal. The logic unit receives the first signal from the voltage generation circuit and the primary signal from the level shifter. The logic unit generates the secondary signal.

The circuit 604 generates the output signal Vout 614 responsive to the input signal V in 612 when the control signal has a logic high state. When the control signal has a logic high state (logic '1'), the first NFET is activated. The secondary signal generated by the logic unit activates the first PFET and the second PFET. The first signal generated by the voltage generation circuit is proportional to a maximum one of the first voltage or the second voltage (i.e., whichever one is higher).

The circuit 604 stops generating the output signal Vout 614 responsive to the input signal V in 612 when the control signal has a logic low state. When the control signal has a logic low state (logic '0'), the first NFET is inactivated, and the third PFET is activated. The secondary signal generated by the logic unit inactivates the second PFET. The first signal generated by the voltage generation circuit is proportional to a voltage at the first node N1.

The switch enables the circuit 604 to operates at high-speed and with low impedance. The circuit 604 support ADC 606 which might operate at high-speed of the order of GSPS. The circuit 604 provides complete switching of the transistors in the switch even when the input signal Vin 612 is as low as 0 volt. This enables the circuit 604 to operate as a high-speed switch with no quiescent current.

Figure 7:
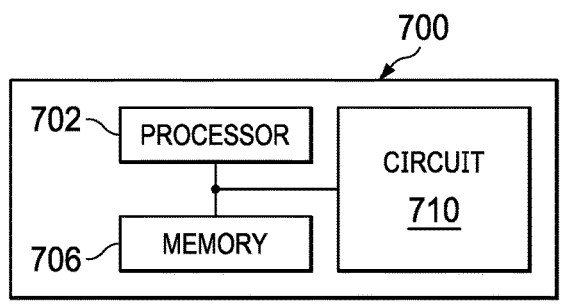
FIG. 7 is a block diagram of an example device in which several aspects of example embodiments can be implemented.

FIG. 7 is a block diagram of an example device 700 in which several aspects of example embodiments can be implemented. The device 700 is, or is incorporated into or is part of, a server farm, a vehicle, a communication device, a transceiver, a personal computer, a gaming platform, a computing device, or any other type of electronic system. The device 700 may include one or more conventional components that are not described herein for brevity.

In one example, the device 700 includes a processor 702 and a memory 706. The processor 702 can be a CISC-type CPU (complex instruction set computer), RISC-type CPU (reduced instruction set computer), a digital signal processor (DSP), a microcontroller, a CPLD (complex programmable logic device) or an FPGA (field programmable gate array).

The memory 706 (which can be memory such as RAM, flash memory, or disk storage) stores one or more software applications (e.g., embedded applications) that, when executed by the processor 702, performs any suitable function associated with the device 700.

The processor 702 may include memory and logic, which store information frequently accessed from the memory 706. The device 700 includes a circuit 710. In one example, the processor 702 may be placed on the same PCB or module as the circuit 710. In another example, the processor 702 is external to the device 700. The circuit 710 can function as a switch. The circuit 710 may include additional analog circuitry, digital circuitry, memory and/or software.

The circuit 710 may include circuitry that is similar, in connection and operation, to the circuit 100 of FIG. 1. The circuit 710 includes a switch, a voltage generation circuit, a level shifter and a logic unit. The voltage generation circuit is coupled to the switch. The level shifter is coupled to voltage generation circuit. The logic unit is coupled to the voltage generation circuit, the level shifter and the switch.

The switch includes first transistors and second transistors. The first transistors include one or more NFETs, and the second transistors include one or more PFETs. The first transistors and the level shifter receive a control signal. The logic unit generates a secondary signal. The second transistors in the switch receive the secondary signal. The first transistors include a first NFET, and a gate terminal of the first NFET receives the control signal. The second transistors include a first PFET and a second PFET. The gate terminals of the first PFET and the second PFET receive a secondary signal.

The voltage generation circuit includes a diode and a third PFET. A source terminal of the third PFET is coupled to drain terminals of the first PFET and the second PFET at a first node N1. Both the diode and the third PFET are coupled to the level shifter and the logic unit. The voltage generation circuit receives the supply voltage, the control signal and a voltage at the first node N1. The voltage generation circuit generates the first signal.

The level shifter receives the first signal (from the voltage generation circuit) and the control signal, and generates a primary signal. The logic unit receives the first signal from the voltage generation circuit and the primary signal from the level shifter. The logic unit generates the secondary signal.

The circuit 710 generates an output signal responsive to an input signal when the control signal has a logic high state. When the control signal has a logic high state (logic '1'), the first NFET is activated. The secondary signal generated by the logic unit activates the first PFET and the second PFET. The first signal generated by the voltage generation circuit is proportional to a maximum one of the first voltage or the second voltage (i.e., whichever one is higher).

The circuit 710 stops generating the output signal responsive to the input signal when the control signal has a logic low state. When the control signal has a logic low state (logic '0'), the first NFET is inactivated, and the third PFET is activated. The secondary signal generated by the logic unit inactivates the second PFET. The first signal generated by the voltage generation circuit is proportional to a voltage at the first node N1.

The switch enables the circuit 710 to operates at high-speed and with low impedance. The circuit 710 support ADCs which operate at high-speeds of the order of GSPS. The circuit 710 provides complete switching of the transistors in the switch even when the input signal is as low as 0 volt. This enables the circuit 710 to operate as a high-speed switch with no quiescent current.

In this description, unless otherwise stated, "about," "approximately" or "substantially" preceding a parameter means being within +/−10 percent of that parameter. Modifications are possible in the described embodiments, and other embodiments are possible, within the scope of the claims.

What is claimed is:

1. A circuit comprising:
a switch including first transistors and second transistors;
a voltage generation circuit coupled to the switch;
a level shifter coupled to the voltage generation circuit and configured to receive a control signal; and
a logic unit coupled to the level shifter and the voltage generation circuit, the logic unit configured to generate a secondary signal, wherein the first transistors are configured to receive the control signal, and the second transistors are configured to receive the secondary signal.

2. The circuit of claim 1, wherein the first transistors include one or more NFETs, the second transistors include one or more PFETs, and the switch is configured to receive an input signal and to generate an output signal.

3. The circuit of claim 2, wherein the first transistors comprise a first NFET having drain and gate terminals, in which the drain terminal is configured to receive the input signal, and the gate terminal is configured to receive the control signal.

4. The circuit of claim 3, wherein the second transistors comprise:
a first PFET having source and gate terminals, in which the source terminal is configured to receive the input signal, and the gate terminal is coupled to the logic unit; and
a second PFET having source and gate terminals, in which the source terminal of the second PFET is coupled to a drain terminal of the first PFET, the gate terminal of the second PFET is coupled to the logic unit, and a drain terminal of the second PFET is coupled to a source terminal of the first NFET.

5. The circuit of claim 4, wherein the voltage generation circuit is coupled to the second transistors and is configured to: receive a supply voltage and the control signal; and generate a first signal.

6. The circuit of claim 5, wherein the voltage generation circuit comprises:
a diode configured to receive the supply voltage; and
a third PFET having source and drain terminals, in which the source terminal is coupled to the second transistors, the drain terminal is coupled to the level shifter, and a gate terminal of the third PFET is configured to receive the control signal.

7. The circuit of claim 5, wherein the voltage generation circuit comprises:
a fourth PFET having a source terminal configured to receive the supply voltage;
a fifth PFET having source and gate terminals, in which the source terminal of the fifth PFET is coupled to a drain terminal of the fourth PFET, and the gate terminal of the fifth PFET is coupled to a gate terminal of the fourth PFET and to the level shifter; and
a sixth PFET having source and drain terminals, in which the source terminal is coupled to the second transistors, the drain terminal is coupled to the level shifter, and a gate terminal of the sixth PFET is configured to receive the control signal.

8. The circuit of claim 5, wherein the level shifter is configured to receive the control signal and the first signal and to generate a primary signal, and the logic unit is configured to receive the first signal and the primary signal.

9. The circuit of claim 6, wherein the logic unit comprises:
a primary PFET having source and gate terminals, in which the source terminal of the primary PFET is coupled to the voltage generation circuit, and the gate terminal of the primary PFET is coupled to the level shifter; and
a secondary NFET having drain and gate terminals, in which the drain terminal of the secondary NFET is coupled to a drain terminal of the primary PFET, the gate terminal of the secondary NFET is coupled to the level shifter, and a source terminal of the secondary NFET is coupled to a ground terminal.

10. The circuit of claim 9, wherein the drain terminals of the primary PFET and the secondary NFET are coupled to the gate terminals of the first PFET and the second PFET.

11. The circuit of claim 10, wherein:
the first signal is equal to a first voltage when the first voltage is greater than a second voltage;
the first signal is equal to the second voltage when the second voltage is greater than the first voltage;
the first voltage is proportional to a voltage at a source terminal of the first PFET; and
the second voltage is proportional to a difference between a threshold voltage of the diode and the supply voltage.

12. The circuit of claim 11, wherein when the control signal has a logic low state:
the third PFET has ON state;
the first signal is equal to the first voltage;
the primary PFET has ON state;
the secondary NFET has OFF state;
the first NFET has OFF state; and
the second PFET has OFF state.

13. The circuit of claim 12, wherein the switch is configured to: when the control signal has the logic low state, stop generating the output signal responsive to the input signal.

14. The circuit of claim 11, wherein when the control signal has a logic high state:
the first signal is equal to the second voltage;
the primary PFET has OFF state;
the secondary NFET has ON state;
the first NFET has ON state; and
the first PFET and the second PFET have ON state.

15. The circuit of claim 14, wherein the switch is configured to: when the control signal has the logic high state, generate the output signal responsive to the input signal.

16. A method comprising:
providing a control signal to first transistors in a switch;
generating a first signal by a voltage generation circuit in response to the control signal and a supply voltage;
generating a primary signal by a level shifter in response to the control signal and the first signal;
generating a secondary signal responsive to the first signal received from the voltage generation circuit and the primary signal received from the level shifter;
providing the secondary signal to second transistors in the switch, the second transistors including a first PFET;
generating an output signal responsive to an input signal by the switch when the control signal has a logic high state; and
inactivating the first transistors and the second transistors in the switch when the control signal has a logic low state and the secondary signal is proportional to a voltage at a drain terminal of the first PFET.

17. The method of claim 16, wherein generating the first signal y the voltage generation circuit includes:
providing the supply voltage to a diode; and
providing the control signal to a third PFET having source terminal, in which the source terminal of the third PFET is coupled to the drain terminal of the first PFET.

18. The method of claim 17, wherein the level shifter is coupled to the diode and to a drain terminal of the third PFET.

19. The method of claim 18, wherein generating the secondary signal includes:
providing the primary signal and the first signal to a primary PFET having source terminal, in which the source terminal of the primary PFET is coupled to the drain terminal of the third PFET; and
providing the primary signal to a secondary NFET having drain terminal, in which the drain terminal of the secondary NFET is coupled to a drain terminal of the primary PFET, and the primary PFET and the secondary NFET are coupled to the level shifter.

20. The method of claim 19, wherein the first signal is equal to a first voltage when the first voltage is greater than a second voltage, the first signal is equal to the second voltage when the second voltage is greater than the first voltage, the first voltage is proportional to a voltage at a drain terminal of the first PFET, and the second voltage is proportional to a difference between a threshold voltage of the diode and the supply voltage.

21. The method of claim 20, wherein generating the output signal includes:
inactivating the primary PFET; and
activating the secondary NFET, the first PFET and the second PFET, wherein the first signal is equal to the second voltage.

22. A device comprising:
- a voltage reference circuit configured to provide an input signal;
- a circuit configured to provide an output signal, the circuit configured to be driven by the input signal; and
- an analog to digital converter (ADC) configured to convert the output signal into a digital signal;
- wherein the circuit includes:
  - a switch including first transistors and second transistors;
  - a voltage generation circuit coupled to the switch;
  - a level shifter coupled to the voltage generation circuit and configured to receive a control signal; and
  - a logic unit coupled to the level shifter and the voltage generation circuit, the logic unit configured to generate a secondary signal;
  - in which the first transistors are configured to receive the control signal, and the second transistors are configured to receive the secondary signal.

* * * * *